United States Patent [19]
Klocek

[11] Patent Number: 6,010,638
[45] Date of Patent: Jan. 4, 2000

[54] CONDUCTIVE/INSULATING GRADED GAAS BULK MATERIAL

[75] Inventor: Paul Klocek, Dallas, Tex.

[73] Assignee: Raytheon Company, Lexington, Mass.

[21] Appl. No.: 07/977,388

[22] Filed: Nov. 17, 1992

Related U.S. Application Data

[63] Continuation-in-part of application No. 07/748,602, Aug. 22, 1991, abandoned.

[51] Int. Cl.[7] .................................................. C30B 29/42
[52] U.S. Cl. ................................ 252/62.36 A; 148/33.1; 117/81; 117/82; 117/83; 117/954
[58] Field of Search ........................ 148/33.1; 156/606, 156/607, 616.1, 616.2, 616.4, DIG. 70; 434/153, 154; 252/62.36 A; 117/81, 82, 83, 954

[56] References Cited

U.S. PATENT DOCUMENTS

| | | | |
|---|---|---|---|
| 3,496,118 | 2/1970 | Willardson et al. | 156/DIG. 70 |
| 4,840,699 | 6/1989 | Khattak et al. | 156/616.41 |
| 4,853,077 | 8/1989 | Lambert et al. | 156/616.2 |
| 4,999,082 | 3/1991 | Kremer et al. | 156/616.2 |
| 5,131,975 | 7/1992 | Bourret-Courchesne | 156/616.2 |

OTHER PUBLICATIONS

Chang et al "Radial Segregation Induced by Natural Convection .", Journal of Crystal Growth, vol. 63 (No. 2) pp. 343–364 Oct. 1983.

*Primary Examiner*—Robert Kunemund
*Attorney, Agent, or Firm*—Baker & Botta, L.L.P.

[57] ABSTRACT

A composition of matter comprising a bulk material of uniform composition having first and second spaced apart surface regions and a dopant in the bulk material of progressively increasing concentration in a direction from the first to said second surface regions providing an interface intermediate the first and second surface regions wherein the portion of the bulk material on one side of the interface is electrically conductive and the portion of the bulk material on the other side of the interface is relatively electrically insulative. The bulk material is one of Ge, Si, group II–VI compounds and group III–V compounds and preferably GaAs or GaP. The dopant is a shallow donor for the bulk material involved and for GaAs and GaP is Se, Te or S. The ratio of the resistivity of the portion of the bulk material on one side of the interface to the portion of the bulk material on the other side of the interface is at least about $1:10^7$.

27 Claims, 3 Drawing Sheets

CONDUCTIVE/INSULATING GRADED GAAS BULK MATERIAL

CROSS REFERENCE TO PRIOR APPLICATIONS

This application is a continuation-in-part of Ser. No. 07/748,602, filed Aug. 22, 1991 now abandoned, the contents of which are incorporated herein by reference.

BACKGROUND OF THE INVENTION

1. Field of the Invention

This invention relates to novel bulk materials doped in a manner to cause rapid change from an electrically conductive portion to an electrically insulative portion resulting from a small change in the doping profile.

2. Brief Description of the Prior Art

No prior art is known wherein a bulk material changes rapidly from electrically insulating to electrically conductive or vice versa as a result of a small change in doping profile thereof.

It is known from the above noted copending application that Si, Ge, Group III-V and Group II-VI compounds and particularly gallium arsenide (GaAs) and gallium phosphide (GaP), if appropriately fabricated (i.e, grown and doped) provide excellent electrooptical (EO) window and dome candidate materials for infrared (1 to 14 $\mu$m wavelength) transparency. Both GaAs and GaP can be doped with a shallow donor in an amount from about $5\times10^{15}$ atoms/cc to about $2\times10^{16}$ atoms/cc with a preferred amount of $8\times10^{15}$ atoms/cc to render the materials conductive with resistivities up to about 0.1 ohm-cm. The above noted copending application discusses GaAs with desired resistivity of from about 0.07 to about 10 ohm-cm with a preferred resistivity of about 0.1 ohm-cm and an electron mobility of greater than about 3000 $cm^2$/volt-second and preferably about 5000 $cm^2$/volt-second. If the amount of carbon in the melt is greater than $1\times10^7$ atoms/cc, then an increased amount of Se must be used, such as about $5\times10^{16}$ atoms/cc with inferior results. The preferred shallow donor for GaAs or GaP is selenium (Se), though tellurium (Te) and sulfur (S) can also be used with inferior results (less uniformity) since Se, which segregates less during growth, fits into the lattice structure of GaAs and GaP better than do Te or S. The shallow donor used, of course, must be matched to the lattice structure of the material with which it will be associated.

A shallow donor is one wherein the amount of energy required to ionize or remove an electron from the outer or valence band is extremely low, the energy at room temperature being more than sufficient to pull the electron off, creating a conduction electron. The conduction electrons have high mobility and result in free-carrier absorption in the material. The high mobility of the conductive electrons creates a large dependence of the free-carrier absorption on wavelength whereby, at longer wavelengths (e.g. about 10 GHz range), the material doped with the shallow donor becomes very highly absorbing with effectively no absorption at lower wavelengths (i.e., the infrared or 1 to 14 micron range).

Another reason for selecting shallow donors is that they are fully ionized at room temperature. At room temperature, the shallow donors will have contributed all of their donor electrons to the conduction band. Therefore, if the temperature of the material changes, there is little change in the physical properties of the material. This conductivity can be controlled so that the GaAs and GaP remain infrared transparent in the IR frequency range while offering substantial electro-magnetic interference (EMI) and electro-magnetic pulse (EMP)(EMI/EMP) protection or shielding and being opaque to frequencies outside the infrared frequency range of interest (i.e., 1 to 14 microns). This protection is due to the coupling of the EMI/EMP to the free carriers in the GaAs or GaP. This coupling causes reflection and, to a much greater extent, absorption of the EMI/EMP. Specifically, n-type GaAs with a resistivity of about 0.1 ohm-cm and high electron mobility greater than 5000 $cm^2$/volt-second has been fabricated by doping with selenium, though tellurium (Te) and sulfur (S) can also be used, resulting in a material with measured optical and EMI/EMP properties as follows:

| n-Type GaAs EMI/EMP Window/Dome Properties | |
|---|---|
| Optical Absorption Coefficients ($cm^{-1}$) | Attenuation @ 15 GHz (dB) |
| <0.02 | >60 |

This highly transparent and EMI/EMP shielding GaAs has no modulation transfer function (MTF) losses. Similar properties are achieved in GaP. These materials provide the solution to the problem of infrared windows and domes with inadequate EMI/EMP protection for EO systems.

The crystal growth as described in the above noted copending application requires that such growth start at the bottom and preferably at the center of the melt and gradually continue outwardly and upwardly toward the sides of a tapered vessel and then only upwardly when the crystal growth has reached the sides of the vessel. Such crystal growth causes a large portion of the impurities in the melt, including a large portion of the shallow donor, to move upwardly in the melt. The result is that the shallow donor doping concentration increases in an upward direction or direction of crystal formation because the donor concentration in the melt continually increases as more of the melt is crystallized.

SUMMARY OF THE INVENTION

In accordance with the present invention, there is provided a material which demonstrates an abrupt change from electrically insulating to electrically conducting due to change in the doping profile therein. This change can be, for example in GaAs, from a resistivity in excess of $10^7$ ohm-cm to a resistivity of less than 10 ohm-cm over a distance of less than one mm. The abrupt transition, for example, takes place at a free carrier concentration in the $10^{14}$ atoms/cc range. This abrupt transition takes place, for example, at approximately $1\times10^{16}$ atoms/cc of shallow donor with a deep donor concentration of approximately $1\times10^{16}$ atoms/cc and a shallow acceptor concentration of approximately $1\times10^{16}$ atoms/cc. The doped bulk material is one of germanium, silicon, a group II-VI or group III-V compound and preferably gallium arsenide or gallium phosphide. The bulk material is doped with a shallow donor for the bulk material in question which is to be made n-type conductive. Selenium, tellurium and sulfur are shallow donors which can be used with gallium arsenide and gallium phosphide with selenium being the preferred shallow donor.

The crystal is grown from the bottom and preferably central portion of the bottom in a direction upwardly and to the side as described in the above noted copending application so that the doping distribution, acting in concert with the native impurities and defects of the bulk material, render the bulk material essentially a two layer material, one layer being highly electrically conductive with a sharp interface and transition to a high resistivity or insulating layer. Such materials have enabling application as EMI shields and electronic devices, such as IR windows and domes and MMIC devices. Electrical devices, such as capacitors and the like can also be fabricated from the bulk material of the present invention by adding an electrically conductive layer over the insulating portion thereof. The ability to change the thickness of the two layers with precision, such as by abrading or the like of the bulk material, allows for modulation of the reflection from one side of the bulk material while providing high attenuation and reflection from the other side of the material in the GHz range. One side is metallic, i.e., high reflection, and the other side is an insulator backed by the conductive layer creating two interfaces where the phase of the incident electromagnetic energy is modulated by its reflection from the outermost insulating surface interfering with the reflection from the insulating/ conduction layer interface.

Briefly, assuming that the bulk material is gallium arsenide (it being understood that any of the above-mentioned other bulk materials can be substituted therefor), a melt of gallium arsenide with selenium of approximately $3 \times 10^{16}$ atoms/cc therein (it being understood that dopants other than selenium may be required for bulk materials other than GaAs) and a boric oxide layer thereover is crystallized by freezing from the bottom up as described in the above noted copending application. The bottom up growth distributes the dopant with continually greater dopant concentration in the upward direction. This is the result of the natural segregation of the dopant. Both the literature and experiment indicate a segregation coefficient of 0.35 for selenium in GaAs. Calculating the segregation or selenium atomic concentration through the thickness of a large 12"×12" vertical gradient freeze crystal of approximately $1 \times 10^{16}$ atoms/cc on the insulating side to $1 \times 10^{17}$ atoms/cc on the opposite side and the resulting electrical resistivity, assuming a deep donor concentration of $2 \times 10^{16}$ atoms/cc and a shallow acceptor concentration of $2 \times 10^{16}$ atoms/cc (e.g. carbon impurity), shows a very sharp resistivity gradient of seven orders of magnitude (FIG. 1). The sharp resistivity or electric conductivity gradient in the GaAs and the fact that one side is semi-insulating ($\geq 10^7$ ohm-cm) and the other side is highly conductive (about 1 ohm-cm) results in a unique sandwich or apparent two layered material. The resulting interaction of electromagnetic energy with this GaAs represents an extremely effective and novel electromagnetic interference (EMI) shielding device with concomitant particular application in the form of an infrared (IR) transparent window or dome for electro-optic sensors on aircraft or missiles. This absorption property affects electromagnetic energy in the 10 to 100 GHz range on the order of a 60 dB or more one way attenuation and about 30 dB or more attenuation below 10 GHz into the MHz region.

The other component to this attenuation, in addition to the absorption, is reflection. On the highly conductive surface, the reflectivity is similar to that of a metal, $\geq 99\%$. To eliminate reflections and still maintain the high absorption and therefore the high EMI shielding in the GHz range, the other or insulating side of this GaAs is of importance. The steep gradient of the resistivity effectively results in two essentially distinct layers in the GaAs. The high resistivity side and the sharp transition therefrom to the highly conductive, low resistivity side results in greatly different reflection characteristics than the metallic-like reflectivity at the conductive side. By grinding and polishing the high resistivity side to, for example, quarter-wave thickness for the electromagnetic energy of interest (e.g. 10 GHz), the reflection can be eliminated or minimized by cancellation of energy reflected from the metallic-like surface by energy of like frequency reflected from the interface after travel of a quarter wave length in each direction through the high resistivity portion. This results in a highly absorbing EMI shield providing IR windows or domes with very little or no reflection of that EM energy. This effect can be produced in Si, Ge, GaAs, GaP, etc.

The effects set forth above are a direct consequence of the novel growth and doping process specifically designed to produce the resistivity gradient through the thickness of the GaAs. The transition is very sharp from a resistivity of about $1 \times 10^7$ to a resistivity of about 10 ohm-cm.

While the attenuation is essentially the same in either direction (see FIGS. 1A and 1B) and the reflectivity in the GHz frequency region of the conductive side is very high (>99%), the reflectivity of the non-conductive (high resistivity) side is significantly lower due to two effects. First, the high resistivity results in a small complex dielectric function (i.e., lower absorption, lower imaginary part of the dielectric function), therefore representing a smaller impedance mismatch at the surface between the GaAs and air. This is similar to common optics where the so-called "Fresnel" reflection takes place at an interface. The reflection amplitude is dependent upon the index of refraction or dielectric constant difference between the two materials at the surface (i.e., GaAs and air). Second, the sharp change in resistivity within the bulk of the GaAs and the thickness of the high resistivity layer before this sharp change will modulate the reflectivity due to interference effects. This is again similar to common optics where surface reflections are commonly controlled by impedance matching layers, usually called anti-reflection (AR) layers. Thus, by grinding the high resistivity side to a specified thickness (e.g., ¼ wavelength), the high resistivity side will act as a quarter wave AR layer at the specified thickness. For example, if the dielectric function of the high resistivity side is $E_R$, the quarter-wave thickness of the high resistivity side is approximately $\lambda/4 (E_R)^{-2}$, where $E_R$ is approximately 12 for GaAs and $\lambda$ is approximately 3 cm for 10 GHz. Therefore, 3 cm/(4×12$^-$2)=2.5 mm. This approximation requires equal intensity reflection from the front surface and the interface, which is not necessarily true and this is only an approximation. Exact calculations of the dielectric function of the two sides of the GaAs are required to obtain exact predictions of these electromagnetic effects.

In summary, the unique GaAs described in the above-mentioned copending application is even more unique than previously described. The consequences of the designed growth process therein result in essentially a two layered GaAs material, one layer being conductive, with a sharp interface to the other high resistivity layer. This novel bulk GaAs material results in highly effective electromagnetic interference (EMI) shielding material which is particularly effective in the GHz frequency range. Another novel aspect of this GaAs is its ability to modulate and thereby minimize the reflection on one side. This is of great interest to applications requiring a material with IR transmission and very high GHz absorption and lower GHz reflection. The GaAs is close to "transparent metal" and with the ability to lower the reflectivity of one side well below that of the near-metallic reflectivity of the other side. It is a transparent non-reflective metal. Beside EMI shielding, the novel GaAs may also be used to fabricate electronic devices based upon GaAs, such as MMIC and other microwave devices. Various GaAs Ifs or other devices can benefit from this novel GaAs since it possesses both a high resistivity (electrically insulating) and an electrically conductive side. This GaAs can be used as a substrate for these type devices. Other novel devices can be based upon this GaAs since it permits propagation and resonance of GHz or microwave frequencies therethrough.

DESCRIPTION OF THE PREFERRED EMBODIMENT

Figure 1A:
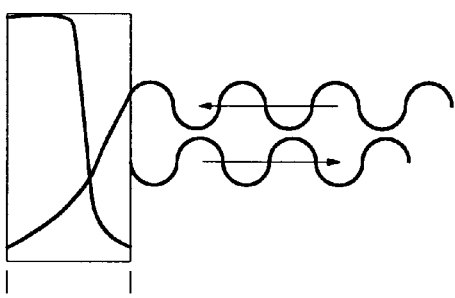
FIGS. 1A and 1B are graphs showing GaAs response in GHz.
Figure 1B:
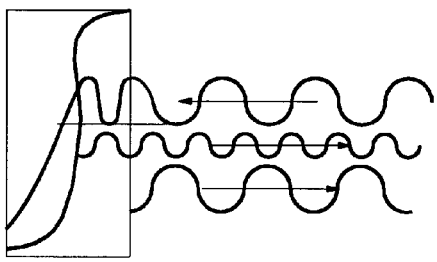
Figure 1C:
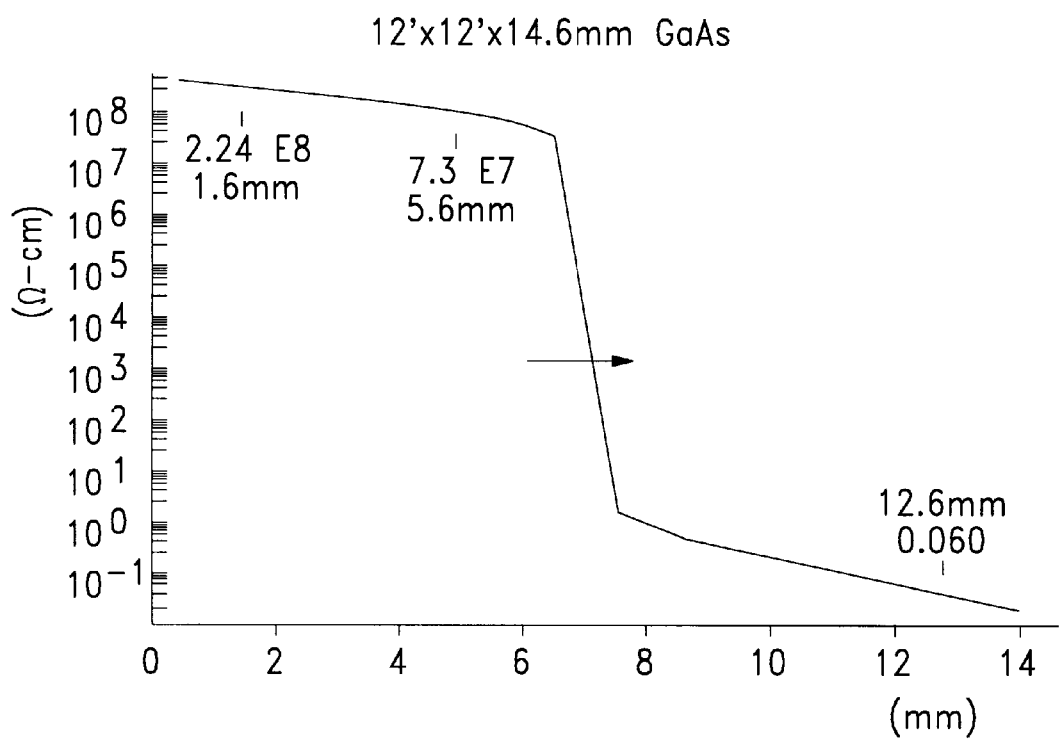
FIG. 1C is a graph showing the change in resistivity with distance from the bottom of a GaAs bulk member formed in accordance with the present invention; (This figure or another figure should show the difference in doping level along the curve)
Figure 2:
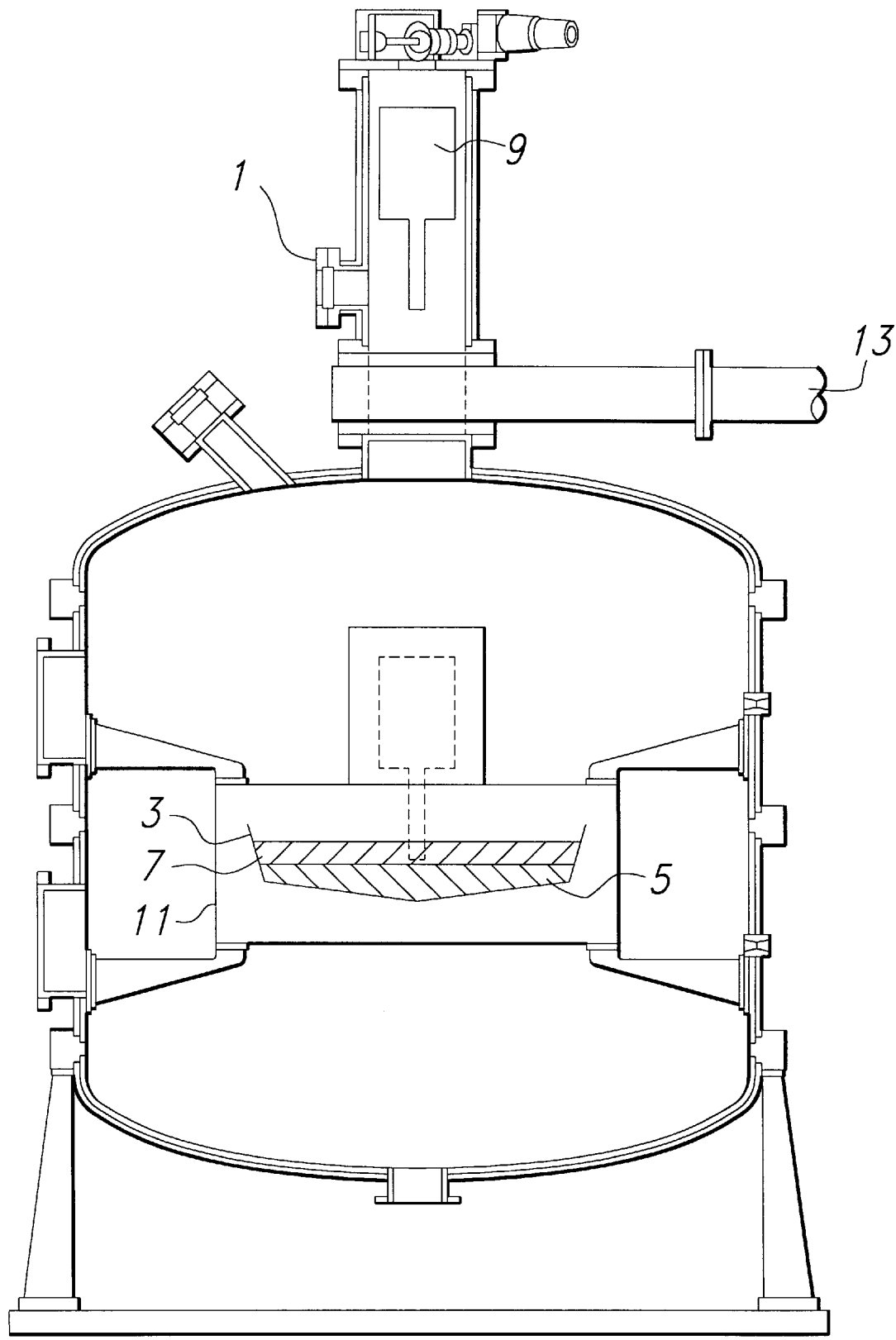
FIG. 2 is a vertical gradient growth apparatus for forming gallium arsenide in accordance with the present invention.

Referring now to FIG. 2, GaAs of optical quality with a uniform and controllable resistivity and with large dimension (e.g., 12 inches by 12 inches) is produced. The process uses a pressure chamber 1 having therein a graphite boat or crucible 3 with tapered sides and bottom into which gallium 5, shallow donor selenium (Se) in an amount of $2 \times 10^{16}$ atoms/cc and boron oxide ($B_2O_3$) glass encapsulant 7 are loaded. Arsenic which has been loaded into an injector 9 made of fused quartz is lowered to the injection position to inject the arsenic into the crucible 3 after opening of the isolation valve 13 to provide a stoichiometric melt of GaAs with the small amount of Se therein in an argon atmosphere at a pressure of 20 to 30 psig.

The chamber 1 is maintained at the pressure of 20 to 30 psig of argon. The furnace 11 and therefore the Ga 5 is heated to a uniform temperature above the melting point of GaAs (1238° C.). In order for the As injection to proceed to completion, the gallium 5 is held from 1 to 15° C. above 1238° C. Too hot or too cold gallium will result in loss of arsenic due to the arsenic vapor pressure overcoming the pressure on the encapsulant 7 or the arsenic exceeding the solubility limit if the gallium is below 1238° C. Stoichiometry is obtained by maintaining the required exact amounts of gallium and arsenic with a small 0.5% or less excess of arsenic to allow for residual arsenic in the injector 9 and small losses from the melt. The control of the exact amount of arsenic to less than 0.5% excess As than needed for stoichiometry is one of the key controls of very low absorption at 1.06 microns.

Figure 3:
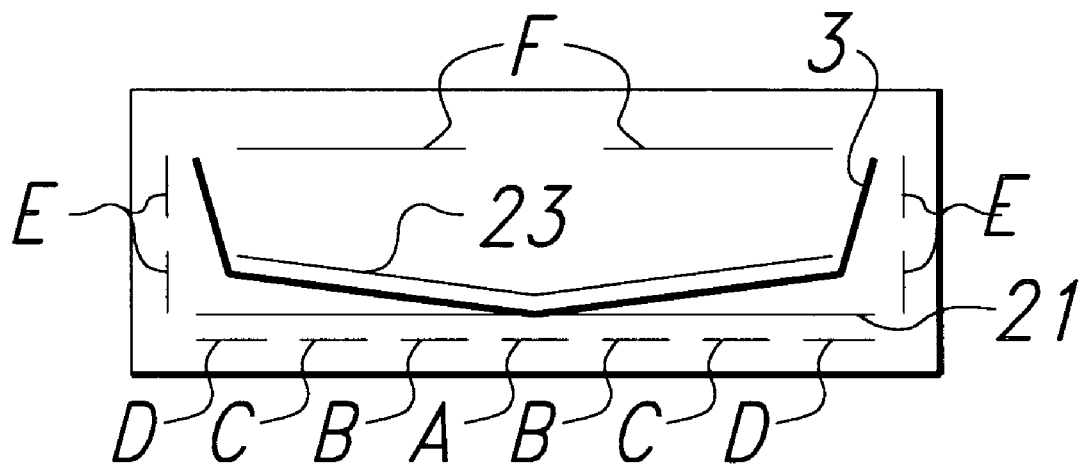
FIG. 3 is a side view of heating element surrounding the crucible of FIG. 2.
Figure 4:
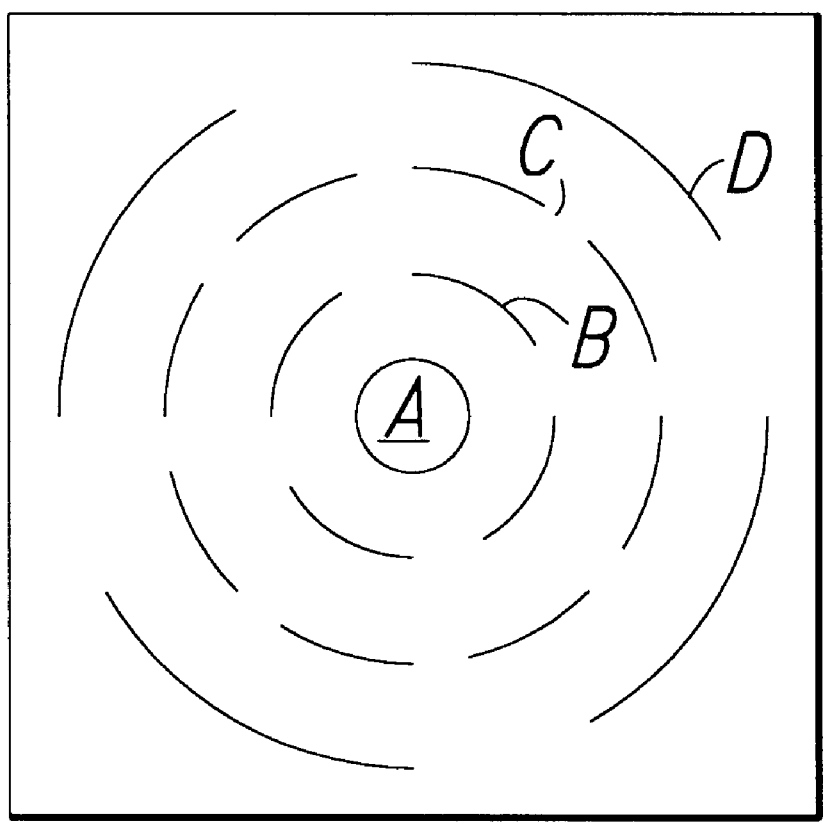
FIG. 4 is a top view of the heating elements of the growth apparatus of FIG. 2.

A multi-zone furnace 11 is used to control the melt and crystal growth. A typical furnace for use in conjunction with the present invention is shown in FIGS. 3 and 4 wherein the graphite boat 3 is shown supported on a boat support 21. A carbon cloth 23, preferably of graphite having a thickness of 20 mils rests over the entire bottom of the boat 3. The boat 3 is surrounded by heating elements of the furnace 11 (FIG. 2) which include, as shown in FIGS. 3 and 4, a single element A beneath the center of the boat, four heating elements B in a circle spaced outwardly from element A, eight elements C in a circle spaced outwardly from elements B, four elements D in a circle spaced outwardly from elements C, sixteen side elements E in two levels spaced in a circle about the boat and two top elements F disposed over the boat.

Once the arsenic has been sublimed into the gallium, forming liquid GaAs encapsulated by the boron oxide glass encapsulant 7 under pressure of 20 to 30 psig in the vessel 3, the GaAs crystal is then frozen or grown from the bottom up.

The growth proceeds with the bottom center zone of the furnace 11 lowering its temperature below the melting point of GaAs, 1238° C. This causes the GaAs melt in the boat 3 to nucleate and begin to grow from the bottom center in a primarily outward and upward direction to the walls of the boat 3 and then primarily in an upward direction under control of the various sections of the furnace 11 as discussed hereinbelow. The boat 3 is tapered on the bottom and sides to aid in beginning the crystal growth at the bottom center and, ultimately, the release of the final crystal from the boat. The temperature of the other bottom zones, designed in a radially symmetric pattern, are lowered below 1238° C., creating a radially symmetric thermal gradient as generally follows with reference to FIGS. 3 and 4:

| Time after As Injection | 1 hr. | 2 hrs. | 3 hrs. | 4 hrs. | 6 hrs. | 9 hrs. |
| --- | --- | --- | --- | --- | --- | --- |
| A | 1230° C. | 1225° C. | 1220° C. | 1215° C. | 1200° C. | 1200° C. |
| B | 1232° C. | 1227° C. | 1222° C. | 1217° C. | 1200° C. | 1200° C. |
| C | 1236° C. | 1235° C. | 1225° C. | 1220° C. | 1205° C. | 1200° C. |
| D | 1236° C. | 1235° C. | 1225° C. | 1220° C. | 1205° C. | 1200° C. |
| Sides | 1245° C. | 1245° C. | 1245° C. | 1240° C. | 1230° C. | 1200° C. |
| Top | 1245° C. | 1245° C. | 1245° C. | 1245° C. | 1240° C. | 1200° C. |

This results in the growth of the crystal from the center up and the center out to the edges. Then the side zone temperatures are lowered at time 4 hours while the top zones are held at 1245° C. This allows a planar vertical interface to advance up through the melt, growing a large flat plate of GaAs. Eventually the temperatures of the side and top zones are lowered to allow completion of the crystal growth. The very small thermal gradients within the growing crystal (less than 20° C.) result in the stoichiometric, low defect, low dislocation GaAs, with a distribution of dopant through the thickness of the crystal. The doping is uniform across the crystal, which is essential for use as a window or dome.

The crystal is annealed at 850° C., by lowering all furnace zones to this temperature at a rate of about 2° C./minute and is held at this temperature for 8 to 12 hours. As the temperatures in the zones are then lowered at about 2° ^C./minute after annealing in the range of 550 to 520° C. and preferably to 530° C., the pressure is vented from the chamber and evacuated with pumps to about −14.7 psig. This causes the $B_2O_3$ glass encapsulant 7 to reboil (dissolved gas bubbles out), resulting in a foaming glass which becomes solid as the furnace lowers in temperature below 400° C. This foamed $B_2O_3$ is too brittle to fracture the crystal as the temperature is lowered to room temperature (about 20 to 25° C.). Once cooled, the crucible 3 with the GaAs crystal and the foamed $B_2O_3$ thereover are placed in alcohol (preferably methanol, ethanol, propanol or isopropanol) and then the $B_2O_3$ is completely dissolved in water, releasing the GaAs crystal from the crucible. The GaAs crystal can now be fabricated into a window.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A composition of matter demonstrating an abrupt change from electrically conductive to electrically insulative on opposing sides of an interface comprising:
   a bulk semiconductor material of uniform composition having first and second spaced apart surface regions, said bulk semiconductor material being doped with a dopant with progressively increasing dopant concentration in a direction from said first to said second surface regions, said doped semiconductor material having an interface intermediate said first and second surface regions, said doped semiconductor material demonstrating an abrupt change from relatively highly electrically conductive on one side of said interface to relatively highly electrically insulative on the opposing side of said interface in the region of said bulk semiconductor material immediately adjacent said interface.

2. The composition of claim 1 wherein said bulk semiconductor material is taken from the class consisting of Ge, Si, group II-VI compounds and group III-V compounds.

3. The composition of claim 1 wherein said bulk semiconductor material is taken from the class consisting of GaAs and GaP.

4. The composition of claim 1 wherein said dopant is a shallow donor.

5. The composition of claim 2 wherein said dopant is a shallow donor.

6. The composition of claim 3 wherein said dopant is taken from the class consisting of Se, Te and S.

7. The composition of claim 1 wherein the ratio of the resistivity of said portion of said bulk semiconductor material immediately adjacent one side of said interface to the portion of said bulk semiconductor material immediately adjacent the other side of said interface is at least about $1:10^7$.

8. The composition of claim 2 wherein the ratio of the resistivity of said portion of said bulk semiconductor material immediately adjacent one side of said interface to the portion of said bulk semiconductor material immediately adjacent the other side of said interface is at least about $1:10^7$.

9. The composition of claim 3 wherein the ratio of the resistivity of said portion of said bulk semiconductor material immediately adjacent one side of said interface to the portion of said bulk semiconductor material immediately adjacent the other side of said interface is at least about $1:10^7$.

10. The composition of claim 4 wherein the ratio of the resistivity of said portion of said bulk semiconductor material immediately adjacent one side of said interface to the portion of said bulk semiconductor material immediately adjacent the other side of said interface is at least about $1:10^7$.

11. The composition of claim 5 wherein the ratio of the resistivity of said portion of said bulk semiconductor material immediately adjacent one side of said interface to the portion of said bulk semiconductor material immediately adjacent the other side of said interface is at least about $1:10^7$.

12. The composition of claim 6 wherein the ratio of the resistivity of said portion of said bulk semiconductor material immediately adjacent one side of said interface to the portion of said bulk semiconductor material immediately adjacent the other side of said interface is at least about $1:10^7$.

13. The composition of claim 3 wherein the free carrier concentration at said interface is about $1 \times 10^{14}$ atoms/cc.

14. The composition of claim 6 wherein the free carrier concentration at said interface is about $1 \times 10^{14}$ atoms/cc.

15. The composition of claim 9 wherein the free carrier concentration at said interface is about $1 \times 10^{14}$ atoms/cc.

16. The composition of claim 12 wherein the free carrier concentration at said interface is about $1 \times 10^{14}$ atoms/cc.

17. The composition of claim 1 wherein the thickness of the electrically insulative side of said bulk semiconductor material is one quarter of a wave length of an electromagnetic radiation impinging thereon.

18. The composition of claim 3 wherein the thickness of the electrically insulative side of said bulk semiconductor material is one quarter of a wave length of an electromagnetic radiation impinging thereon.

19. The composition of claim 6 wherein the thickness of the electrically insulative side of said bulk semiconductor material is one quarter of a wave length of an electromagnetic radiation impinging thereon.

20. The composition of claim 12 wherein the thickness of the electrically insulative side of said bulk semiconductor material is one quarter of a wave length of an electromagnetic radiation impinging thereon.

21. The composition of claim 13 wherein the thickness of the electrically insulative side of said bulk semiconductor material is one quarter of a wave length of an electromagnetic radiation impinging thereon.

22. The composition of claim 14 wherein the thickness of the electrically insulative side of said bulk semiconductor material is one quarter of a wave length of an electromagnetic radiation impinging thereon.

23. The composition of claim 15 wherein the thickness of the electrically insulative side of said bulk semiconductor material is one quarter of a wave length of an electromagnetic radiation impinging thereon.

24. The composition of claim 16 wherein the thickness of the electrically insulative side of said bulk semiconductor material is one quarter of a wave length of an electromagnetic radiation impinging thereon.

25. The composition of claim 1 wherein the resistivity of a portion of said bulk semiconductor material along a distance of less than about one millimeter in a direction from said first to said second surface region and including said interface changes by a factor of from about 10 to about $10^7$ ohm-centimeters.

26. The composition of claim 3 wherein the resistivity of a portion of said bulk semiconductor material along a distance of less than about one millimeter in a direction from said first to said second surface region and including said interface changes by a factor of from about 10 to about $10^7$ ohm-centimeters.

27. The composition of claim 5 wherein the resistivity of a portion of said bulk semiconductor material along a distance of less than about one millimeter in a direction from said first to said second surface region and including said interface changes by a factor of from about 10 to about $10^7$ ohm-centimeters.

* * * * *